(12) United States Patent
Kamiyama et al.

(10) Patent No.: US 6,704,208 B2
(45) Date of Patent: Mar. 9, 2004

(54) PRINTED CIRCUIT BOARD AND MANUFACTURING METHOD THEREOF

(75) Inventors: Koichi Kamiyama, Tokyo (JP); Hisanori Yoshimizu, Yokosuka (JP); Shigeru Michiwaki, Yokohama (JP)

(73) Assignee: Victor Company of Japan, Ltd., Yokohama (JP)

(*) Notice: Subject to any disclaimer, the term of this patent is extended or adjusted under 35 U.S.C. 154(b) by 29 days.

(21) Appl. No.: 10/238,609

(22) Filed: Sep. 11, 2002

(65) Prior Publication Data

US 2003/0063443 A1 Apr. 3, 2003

(30) Foreign Application Priority Data

Oct. 1, 2001 (JP) .......................... 2001-304908

(51) Int. Cl.[7] .................................. H05K 1/18
(52) U.S. Cl. .................. 361/763; 361/765; 361/795
(58) Field of Search ................. 361/763–767, 361/795; 174/258–262, 266

(56) References Cited

U.S. PATENT DOCUMENTS

| 4,951,175 | A | * | 8/1990 | Kurosawa et al. | ........... 361/313 |
| 5,273,927 | A | * | 12/1993 | Gnadinger | ...................... 438/3 |
| 5,821,626 | A | * | 10/1998 | Ouchi et al. | ................ 257/778 |
| 6,181,569 | B1 | * | 1/2001 | Chakravorty | ............... 361/761 |
| 6,323,434 | B1 | * | 11/2001 | Kurita et al. | ................ 174/255 |
| 6,392,898 | B1 | * | 5/2002 | Asai et al. | ................... 361/794 |

FOREIGN PATENT DOCUMENTS

| JP | 8-204341 | 8/1996 |
| JP | 9-116247 | 5/1997 |
| JP | 10-56251 | 2/1998 |
| JP | 2001-15928 | 1/2001 |

* cited by examiner

Primary Examiner—John B. Vigershin
Assistant Examiner—Tuan Dinh
(74) Attorney, Agent, or Firm—Connolly Bove Lodge & Hutz LLP

(57) ABSTRACT

A manufacturing method of a printed circuit board is composed of a first process of forming a pattern of lower electrode 4a at a specific portion on a substrate 2 in which a capacitor element 16 is formed, a second process of forming a capacitor insulative layer 6 that is constituted by a paste material having high permittivity selectively at a position that corresponds to the lower electrode 4a, a third process of forming an interlayer insulative film 8 having low permittivity all over the entire surface of the substrate 2 including the capacitor insulative layer 6, a fourth process of exposing the capacitor insulative layer 6 by grinding the surface of the interlayer insulative film 8 so as to be flat, and a fifth process of forming a capacitor element 16 by forming a pattern of upper electrode on the surface of the capacitor insulative layer 6. Accordingly, the printed circuit board is excellent in mechanical strength, low in manufacturing cost and high in reliability and capacitance accuracy.

4 Claims, 3 Drawing Sheets

PRINTED CIRCUIT BOARD AND MANUFACTURING METHOD THEREOF

BACKGROUND OF THE INVENTION

1. Field of the Invention

The present invention is related to a printed circuit board with a built-in capacitor and a manufacturing method thereof, particularly, related to a printed circuit board, which is excellent in electrical characteristics and high density, and a manufacturing method thereof.

2. Description of the Related Arts

In recent years, demand for a printed circuit board is increasing year by year so as to cope with higher density and higher frequency as an electric apparatus is advanced to high density and high speed. Miniaturizing a component is advanced so as to make mounting density of a printed circuit board higher. However, miniaturizing more than a current level almost reaches the limit in consideration of mounting yield. Further, mounting design of a printed circuit board is getting harder extremely due to conditions of allocating a bypass capacitor, which should be mounted in the neighborhood of a terminal of IC.

In the past, a passive electronic component such as capacitor and resister is connected electrically to a printed circuit board by solder mounting. However, in view of the above-mentioned requirement, recently, a method of forming an interlayer capacitor that is constituted by a material having high permittivity, which is used as an interlayer insulative film of printed circuit board, and another method of filling up an interlayer of printed circuit board with a material having high permittivity locally and utilizing as an interlayer capacitor has been proposed (for example, Japanese Patent Application Laid-open Publication Nos. 2001-15928 and 9-116247/1997).

However, in the case of the former method, permittivity of the insulative film (layer) that is used in the interlayer is uniform, so that a capacitance value is essential to be adjusted by its area when a different capacitance value is required. Therefore, the method is disadvantageous to a degree of freedom from limitation based on designing or high density. Consequently, such an interlayer capacitor is merely used for a capacitor for noise reduction.

In the case of the latter method, as disclosed in the Patent Publications mentioned above, an opening of which area is equivalent to a required capacitance value is formed on a layer, which is composed of a material having low permittivity, by a $CO_2$ laser or the photo-etching method. The opening is filled up with a material having high permittivity, and then a local capacitor is formed.

In this case, however, a gap generates at an interface between the materials having high permittivity and low permittivity respectively due to hardening contraction when hardening the material having high permittivity and different thermal expansion rates between the materials having high permittivity and low permittivity. Consequently, there existed problems such that a conductive material penetrates into the gap and resulted in short-circuiting a lower electrode and an upper electrode and failing to function as a capacitor, and the interlayer capacitor is less in reliability. In the particular case, there existed a further method of forming a dielectric layer by a dry process such as the sputtering method so as to improve adhesiveness of the interface between the layers constituted by the materials having high permittivity and low permittivity respectively. However, the further method is disadvantageous to productivity and processing cost.

SUMMARY OF THE INVENTION

Accordingly, in consideration of the above-mentioned problems of the prior arts, an object of the present invention is to provide a printed circuit board, which is high in mechanical strength, reliability and capacitance accuracy and further low in manufacturing cost, and a manufacturing method thereof In order to achieve the above object, the present invention provides, according to an aspect thereof, a manufacturing method of a printed circuit board comprising steps of: forming a pattern of lower electrode at a portion to be formed with a capacitor element on a substrate; forming a capacitor insulative layer constituted by a paste material having high permittivity selectively at a position corresponding to the lower electrode; forming an interlayer insulative film having low permittivity all over the entire surface of the substrate including the capacitor insulative layer; exposing the capacitor insulative layer by grinding the surface of the interlayer insulative film so as to be flat; and forming a capacitor element by forming a pattern of upper electrode on the surface of the capacitor insulative layer.

According to another aspect of the present invention, there provided a printed circuit board composed of: a substrate; a lower electrode formed with a pattern at a portion to be formed with a capacitor element on the substrate; a capacitor insulative layer of a paste material having high permittivity formed selectively at a position corresponding to the lower electrode; an interlayer insulative film having low permittivity formed all over the entire surface of the substrate including the capacitor insulative layer; and an upper electrode constituting a capacitor element formed with a pattern on the surface of the capacitor insulative layer that is exposed by grinding the surface of the interlayer insulative film so as to be flat.

Other object and further features of the present invention will be apparent from the following detailed description when read in conjunction with the accompanying drawings.

DETAILED DESCRIPTION OF THE PREFERRED EMBODIMENTS

First Embodiment

Figure 1A:
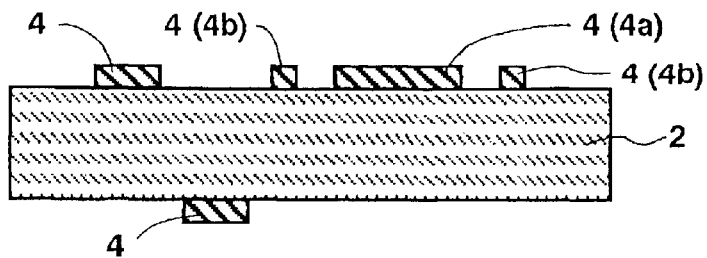
FIGS. 1(a) to 1(h) are cross sectional views of a printed circuit board showing a manufacturing method according to a first embodiment of the present invention.

According to the present invention, a manufacturing method of a printed circuit board is composed of a first process of forming a pattern of lower electrode at a specific portion on a printed circuit board in which a capacitor element is formed, a second process of forming a capacitor insulative layer that is constituted by a paste material having high permittivity selectively at a position that corresponds to the lower electrode, a third process of forming an interlayer insulative film having low permittivity all over the entire surface of the printed circuit board including the capacitor insulative layer, a fourth process of exposing the capacitor insulative layer by grinding the surface of the interlayer insulative film so as to be flat, and a fifth process of forming a capacitor element by forming a pattern of upper electrode on the surface of the capacitor insulative layer.

With respect to lack of adhesiveness between an interlayer insulative film having low permittivity and a capacitor insulative layer, which is constituted by a paste material having high permittivity, and a gap between them, printing a paste material having high permittivity and laminating an insulative layer having low permittivity over the printed paste material can improve the adhesiveness that is the current major subject. It is desirable for undulation and unevenness, which is occurred by laminating the interlayer insulative film having low permittivity on the paste material having high permittivity, to be flatten as flat as possible under laminating conditions such as pressure, temperature and multistage press working.

Further, by grinding the interlayer insulative film having low permittivity together with the capacitor insulative layer having high permittivity by using a buff wheel that is excellent in smoothness so as to expose the paste material having high permittivity and to be a necessary capacitance value, an amount of scatter in capacitance values can be decreased.

Furthermore, in a case of a pattern structure containing a thin film resister, by applying surface roughness of the buff wheel, a sheet resister that is adjusted to the surface roughness can be obtained.

More, by printing a paste material having high permittivity in a larger area than a lower electrode, an amount of scatter in capacitance values can be suppressed because thickness of a circumference becomes thinner due to printing sag.

Moreover, if a dam pattern that prevent a paste material having high permittivity from fluxing is formed around the lower electrode when forming an inner layer pattern, thickness of the paste material can be controlled.

In addition thereto, by printing the paste material in a circular shape, a printed shape becomes uniform. Consequently, the circular shape is resistive to chipping of the paste material by stress concentration while grinding and a gap in comparison with a rectangular shape.

Accordingly, a printed circuit board with a built-in capacitor, which is low in manufacturing cost, high in reliability and capacitance accuracy, can be provided.

With referring to FIGS. 1(a) through 3, an actual manufacturing method of a printed circuit board is detailed next.

FIGS. 1(a) to 1(h) are cross sectional views of a printed circuit board showing a manufacturing method according to a first embodiment of the present invention.

Figure 2:
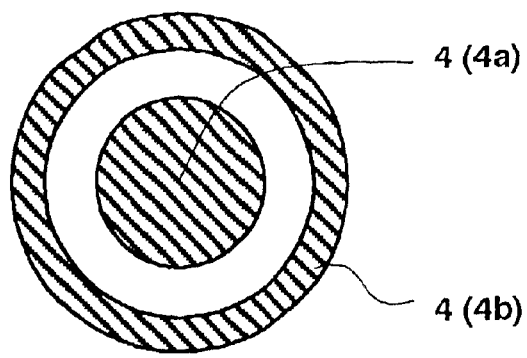
FIG. 2 is an enlarged plan view showing positional relationship between a lower electrode and a dam pattern according to the first embodiment of the present invention.

FIG. 2 is an enlarged plan view showing positional relationship between a lower electrode and a dam pattern according to the first embodiment of the present invention.

Figure 1B:
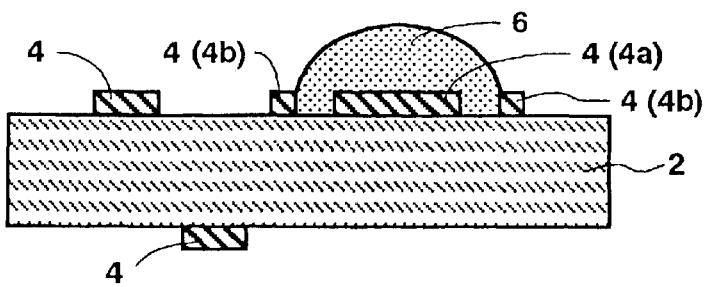
Figure 3:
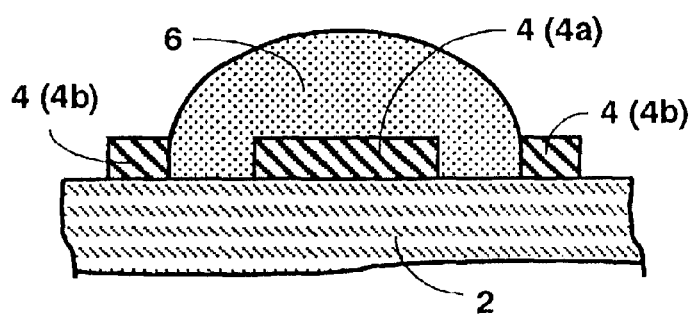
FIG. 3 is a cross sectional view of the printed circuit board shown in FIG. 1(b) for explaining an effect of the dam pattern.

FIG. 3 is an enlarged cross sectional view of the printed circuit board shown in FIG. 1(b) for explaining an effect of the dam pattern.

In FIG. 1(a), a substrate 2 of printed circuit board is constituted by a laminated board of glass epoxy resin, for example, or an insulative board alone. Predetermined inner layer patterns 4, 4a and 4b (generically referred to as inner layer pattern 4) that is constituted by copper foil, for example, are formed on the surface of the substrate 2 by a pattern etching process, wherein the inner pattern 4a is formed so as to be a lower electrode of a capacitance element. On the upper side of the substrate 2, a lower electrode 4a in a circular shape as shown in FIG. 2 is formed in a portion to be formed with a capacitor element as an inner layer pattern, and a dam pattern 4b in a ring shape is formed so as to surround the lower electrode 4a.

FIGS. 1(a) to 1(h) exhibit a case that the inner layer pattern 4 is formed on both sides of the substrate 2. However, it should be understood that the inner layer pattern 4 could be formed on either side of the substrate 2.

In order to increase adhesive strength with a resin that is laminated on the inner layer pattern 4 in a later process, a micro etching process is applied on the surface of each inner layer pattern 4 by using the etching solution "CZ-8100" by Mec Company Ltd., for example, and the surface is roughened.

As shown in FIG. 1(b), a capacitor insulative layer 6 that is constituted by a paste material having high permittivity is selectively formed on a portion that corresponds to the lower electrode 4a. With respect to a forming method of the capacitor insulative layer 6, a paste material having high permittivity that contains filler in high permittivity such as barium titanate is printed in 30 $\mu$m thick by using the #180 mesh screen, and hardened completely. Consequently, the capacitor insulative layer 6 is formed. A shape of the capacitor insulative layer 6 is a circle and the diameter of the circle is approximately 0.3 mm to 0.5 mm, for example.

Further, the dam pattern 4b for preventing the flux is provided as shown in FIG. 3, so that a paste material having low viscosity (low thixotropic index) can be used. Therefore, the paste material having low viscosity can be supplied through a dispenser. It should be understood that the dam pattern 4b is not necessary to be provided if the paste material is free from fluxing.

Figure 1C:
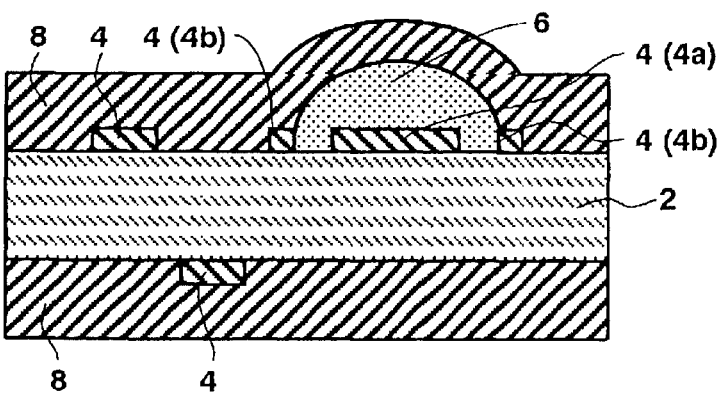

As shown in FIG. 1(c), an interlayer insulative film 8 having low permittivity is formed all over the entire surface of the substrate 2 including the capacitor insulative layer 6. In this first embodiment shown in FIG. 1(c), the interlayer insulative film 8 is also formed on the under surface of the substrate 2.

With respect to the interlayer insulative film 8, a insulative material having low permittivity such as epoxy resin and polyolefin resin is laminated all over the entire surface of the substrate 2 so as to be approximately 40 $\mu$m thick, for example. It is acceptable that the interlayer insulative film 8 is flattened through a two-stage press working process.

Figure 1D:
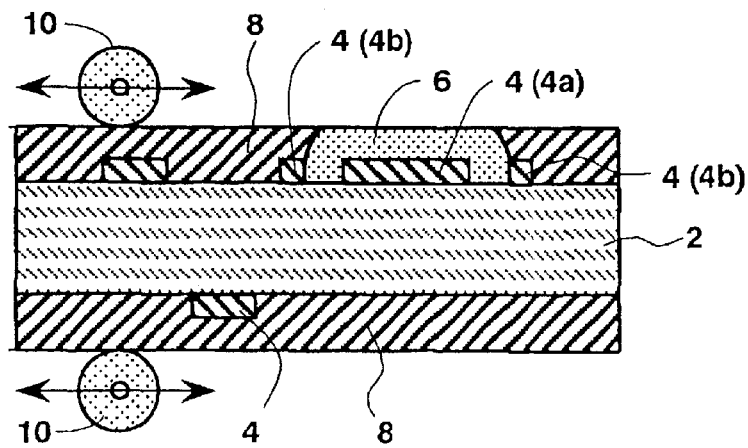

As shown in FIG. 1(d), grinding the surface of the interlayer insulative film 8 so as to be flat exposes the capacitor insulative layer 6. In this case, by using a buff wheel 10 made by nonwoven fabric (for example, "Surface 800M" manufactured by Jaburo Industry Co., Ltd.), both the interlayer insulative film 8 and the capacitor insulative layer 6 are ground simultaneously so as to be necessary thickness that corresponds to a required capacitance value. The interlayer insulative film 8 formed on the under surface of the substrate 2 is also ground if necessary.

Figure 1E:
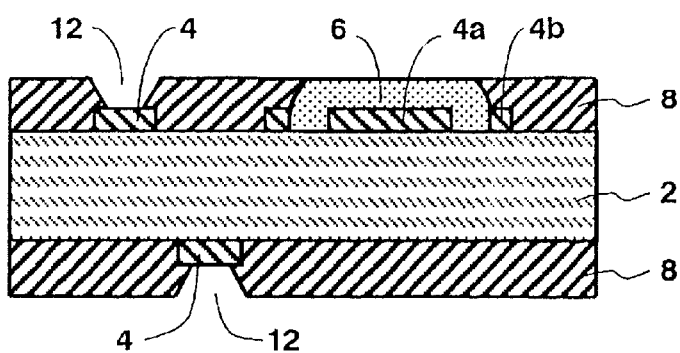

As shown in FIG. 1(e), by using a $CO_2$ laser beam or a drill bit, a blind via hole 12 for interlayer connection is formed at a necessary position that corresponds to the inner layer pattern 4.

Figure 1F:
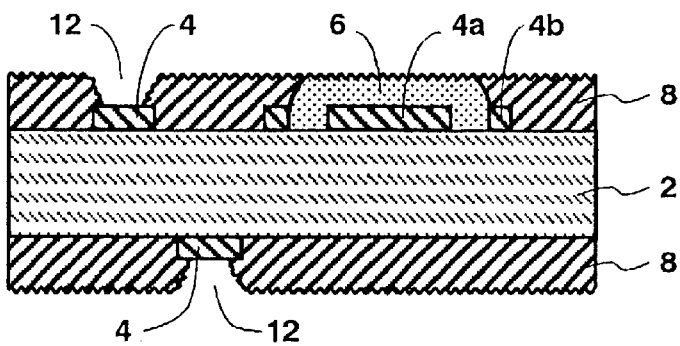

As shown in FIG. 1(f), the surfaces of the interlayer insulative film 8 and the capacitor insulative layer 6 are processed through the plasma etching method by using gas such as argon and oxygen for the purpose of activating and micro etching. In this process, the surface roughening can be processed through the wet process method by potassium permanganate in accordance with a resin material.

Figure 1G:
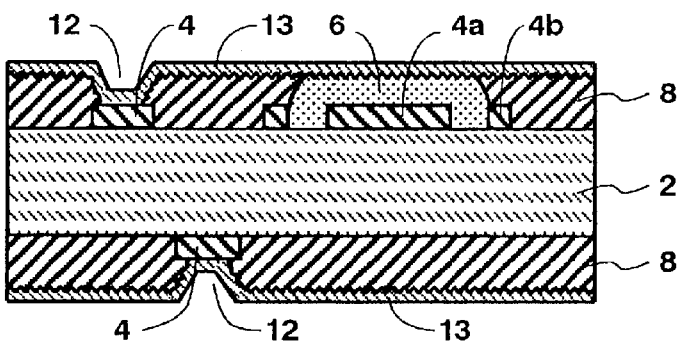

As shown in FIG. 1(g), electrical conductor of nickel or nickel alloy is formed on the activated or roughened surfaces of the interlayer insulative film 8 and the capacitor insulative layer 6 through the electroless plating method or the sputtering method, and then a foundation film 13 is formed all over the top and under surfaces after the copper electroplating method is applied on the electrical conductor.

Figure 1H:
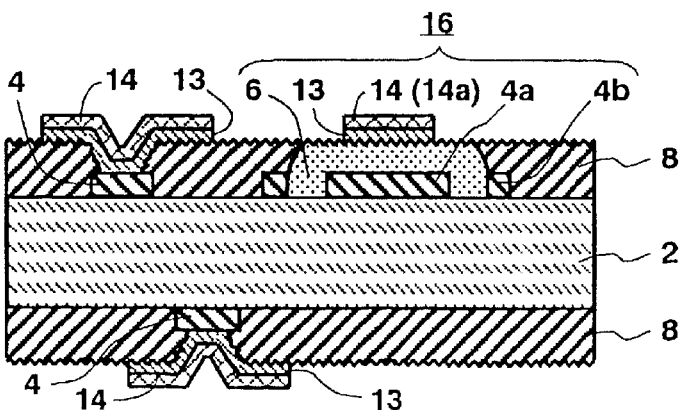

As shown in FIG. 1(h), an outer layer pattern 14 is formed in accordance with the inner layer pattern 4 including the lower electrode 4a, wherein the outer layer pattern 4 including the lower electrode 14a. Consequently, a capacitor element 16 is formed. In this process, the foundation film 13 is also patterned simultaneously.

With respect to patterning of the outer layer pattern 14 and the foundation film 13, the pattern can be formed by the solution of copric chloride or copper (II) chloride through dry film resist and ED (Electro Deposition) resist.

Finally, solder resist for a land for soldering, silk printing and surface treatment (such as gold plating and heat-resistant flux) is processed thereafter.

Second Embodiment

In the above-mentioned first embodiment, forming the capacitor element 16 alone is explained as one example. However, it is applicable that a thin film resistor is formed together with the capacitor element 13.

Figure 4:
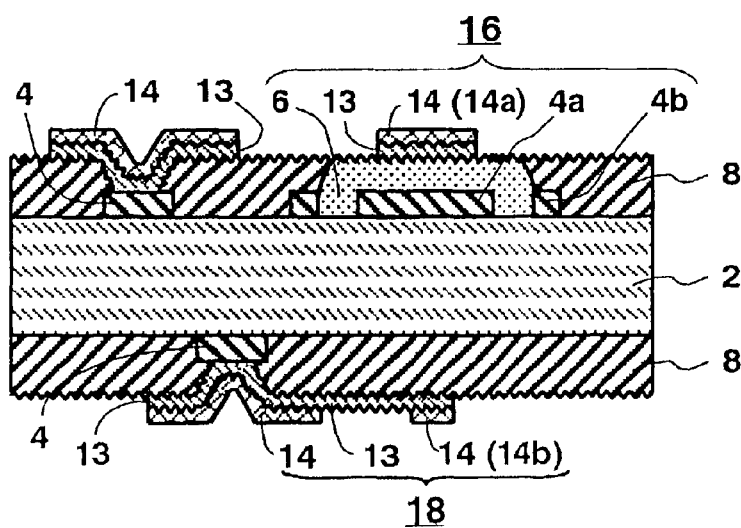
FIG. 4 is a cross sectional view of a printed circuit board showing a manufacturing method of forming a capacitor element and a resister element simultaneously according to a second embodiment of the present invention.

FIG. 4 is a cross sectional view of a printed circuit board showing a manufacturing method of forming a capacitor element and a resistor element simultaneously according to a second embodiment of the present invention.

A series of manufacturing processes of forming a capacitor element and a resistor element simultaneously is identical to that of forming the capacitor element 16 shown in FIGS. 1(a) through 1(g) and followed by a process shown in FIG. 4 instead of the process shown in FIG. 1(h). In other words, when the foundation film 13 that is constituted by the copper plated nickel alloy is formed as shown in FIG. 1(g), the outer layer patterns 14 including upper electrodes 14a and 14b are formed while remaining a part of the foundation film 13 where a thin film resistor is formed. Only copper of the foundation film 13 that is allocated in a portion to be formed with a thin film resistor is removed through a partial etching process by using partial resist. Accordingly, as shown in FIG. 4, a thin film resistor 18 that is constituted by the nickel alloy can be formed.

In FIG. 4, the capacitor element 16 and the thin film resistor 18 is formed on either side of the substrate 2 respectively. However, it should be understood that they could be formed on both sides of the substrate 2 respectively.

According to an aspect of the present invention, as mentioned above, there provided a printed circuit board and a manufacturing method thereof, wherein the printed circuit board is excellent in mechanical strength, low in manufacturing cost, and high in reliability and capacitance accuracy.

Further, when a dam pattern is formed, the dam pattern can prevent a capacitor insulative layer from fluxing, particularly; it is possible to improve capacitance accuracy more.

It will be apparent to those skilled in the art that various modification and variations could be made in the thin film resistor element in the present invention without departing from the scope or spirit of the invention.

What is claimed is:

1. A manufacturing method of a printed circuit board comprising steps of:

forming a pattern of lower electrode at a portion to be formed with a capacitor element on a substrate;

forming a capacitor insulative layer constituted by a paste material having a first permittivity selectively at a position corresponding to the lower electrode;

forming an interlayer insulative film having a second permittivity lower permittivity than the first pemittivity all over the entire surface of the substrat including the capaction insulative layer. exposing the capcitor insulative layer by griding the surface of the interlayer insulative film so as to be flat; and forming a pattern of an upper electrode on the surface of the capacitor insulative layer so as to sandwhich the capacitor insulative layer between the lower electrode and the upper electrode;

wherein the capacitor insulative layer sandwhich between between the lower electrode and the upper electrode is formed as a capacitor element.

2. The manufacturing method of a printed circuit board as claimed in claim 1, the method further comprises a step of forming a dam pattern that prevents the capacitor insulative layer constituted by a paste material having high permittivity from fluxing around the lower electrode.

3. The manufacturing method of a printed circuit board as claimed in claim 1, the method further comprising steps of:

forming a foundation film of copper plated nickel alloy all over the entire surface of the substrate;

forming the upper electrode with remaining the foundation film at a portion to be formed with a thin film resistor; and forming a thin film resistor constituted by a nickel alloy by etching copper of the foundation film at the portion to be formed with the thin film resistor selectively.

4. A printed circuit board comprising:

a substrate;

a lower electrode formed with a pattern at a portion to be formed with a capacitor element on the substrate;

a capacitor insulative layer of a paste material having a first permittivity formed selectively at a position corresponding to the lower electrode, an interlayer insulative film having a second permittivity lower than the first permittivity formed all over the entire surface of the substrate including the capacitor insulative layer; and an upper electrode formed with pattern on the surface of the capacitor insulative layer that is exposed by grinding the surface of the interlayer insulative film so as to be flat, wherein the capacitor insulative layer sandwhich between between the lower electrode and the upper electrode is formed as a capacitor element.

* * * * *